(12) United States Patent
Zierath et al.

(10) Patent No.: US 10,651,082 B2
(45) Date of Patent: May 12, 2020

(54) DIFFUSION BARRIERS (71) Applicant: Intel Corporation, Santa Clara, CA (US)

(72) Inventors: Daniel J. Zierath, Portland, OR (US); Jason A. Farmer, Hillsboro, OR (US); Daniel B. Bergstrom, Lake Oswego, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/081,713

(22) PCT Filed: Mar. 31, 2016

(86) PCT No.: PCT/US2016/025139
§ 371 (c)(1),
(2) Date: Aug. 31, 2018

(87) PCT Pub. No.: WO2017/171767
PCT Pub. Date: Oct. 5, 2017

(65) Prior Publication Data
US 2019/0088538 A1    Mar. 21, 2019

(51) Int. Cl.
H01L 21/768       (2006.01)
H01L 23/532       (2006.01)
C23C 16/34        (2006.01)
C23C 16/455       (2006.01)
H01L 21/285       (2006.01)

(52) U.S. Cl.
CPC ........ *H01L 21/76846* (2013.01); *C23C 16/34* (2013.01); *C23C 16/45529* (2013.01); *C23C 16/45531* (2013.01); *H01L 21/28562* (2013.01); *H01L 21/76843* (2013.01); *H01L 21/76856* (2013.01); *H01L 23/53209* (2013.01); *H01L 23/53223* (2013.01); *H01L 23/53238* (2013.01)

(58) Field of Classification Search
CPC combination set(s) only.
See application file for complete search history.

(56) References Cited

U.S. PATENT DOCUMENTS

| | | | |
|---|---|---|---|
| 6,002,174 A * | 12/1999 | Akram | H01L 21/28568 257/751 |
| 2002/0000598 A1 | 1/2002 | Kang et al. | |
| 2002/0163025 A1 | 11/2002 | Vaartstra et al. | |
| 2004/0009654 A1 | 1/2004 | Abe | |
| 2006/0118159 A1 * | 6/2006 | Tsuneoka | H01L 35/04 136/211 |

(Continued)

OTHER PUBLICATIONS

International Search Report and Written Opinion issued in PCT Application No. PCT/US2016/025139 dated Mar. 13, 2017; 13 pages.

*Primary Examiner* — Ratisha Mehta
(74) *Attorney, Agent, or Firm* — Patent Capital Group (57) ABSTRACT

In an example, there is disclosed a chemical compound, including a transition metal, a post-transition metal, a metalloid, and a nonmetal. By way of non-limiting example, the post-transition metal may be aluminum. The transition metal is selected from the group consisting of tungsten, tantalum, hafnium, molybdenum, niobium, zirconium, vanadium, and titanium. The metalloid may be boron or silicon. The nonmetal may be carbon or nitrogen. The compound may be used, for example, as a barrier material in an integrated circuit.

25 Claims, 2 Drawing Sheets (56) References Cited

U.S. PATENT DOCUMENTS

| | | | |
|---|---|---|---|
| 2010/0025780 A1 | 2/2010 | Kaneko et al. | |
| 2010/0068556 A1 | 3/2010 | Lemmon et al. | |
| 2014/0183662 A1* | 7/2014 | Zhang ................ | H01L 27/0207 |
| | | | 257/401 |

* cited by examiner

DIFFUSION BARRIERS

CROSS-REFERENCE TO RELATED APPLICATION

This application is a national stage application under 35 U.S.C. § 371 of PCT International Application Serial No. PCT/US2016/025139, filed on Mar. 31, 2016 and entitled "DIFFUSION BARRIERS," which is hereby incorporated by reference in its entirety.

FIELD OF THE SPECIFICATION

This disclosure relates in general to the field of semiconductor devices, and more particularly, though not exclusively to, a system and method for providing improved diffusion barriers.

BACKGROUND

A diffusion barrier is a thin layer of metal placed either between a metal and a dielectric, or between two other metals to act as a barrier against diffusion of at least one of the metals into the other metal or dielectic. Such diffusion may cause corruption, which can lead to undesirable side effects. Common diffusion barriers can range in thickness from nanometers to microns.

BRIEF DESCRIPTION OF THE DRAWINGS

The present disclosure is best understood from the following detailed description when read with the accompanying figures. It is emphasized that, in accordance with the standard practice in the industry, various features are not necessarily drawn to scale, and are used for illustration purposes only. Where a scale is shown, explicitly or implicitly, it provides only one illustrative example. In other embodiments, the dimensions of the various features may be arbitrarily increased or reduced for clarity of discussion.

SUMMARY

In an example, there is disclosed a chemical compound, including a transition metal, a post-transition metal, a metalloid, and a non-metal. By way of non-limiting example, the post-transition metal may be aluminum. The transition metal is selected from the group consisting of tungsten, tantalum, hafnium, molybdenum, niobium, zirconium, vanadium, and titanium. The metalloid may be boron or silicon. The nonmetal may be carbon or nitrogen. The compound may be used, for example, as a barrier material in an integrated circuit.

EMBODIMENTS OF THE DISCLOSURE

The following disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples. This repetition is for the purpose of simplicity and clarity and does not in itself dictate a relationship between the various embodiments and/or configurations discussed. Different embodiments may have different advantages, and no particular advantage is necessarily required of any embodiment.

An integrated circuit or monolithic integrated circuit (also referred to as an IC, a chip, or a microchip) is a set of electronic circuits on one small plate ("chip") of semiconductor material, normally silicon. Modern integrated circuits (ICs) are popularly built on a monocrystalline silicon substrate. Manufacturing ICs may be divided into two or more major sub-processes. The "front end of the line" (FEOL) is the process of creating individual devices (e.g., capacitors, resistors, and many, many transistors) on the silicon substrate. Once the individual devices are placed on the chip, the second stage is "back end of the line" (BEOL), in which interconnects are placed to distribute clock signals and power to individual components, as well as interconnects to connect components to one another on the chip. Finally, in back-end or "advanced packaging," seal layers and external connections such as solder bumps or lead lines, are added.

Because modern integrated circuits can contain millions or billions of individual transistors and other components, interconnection can be an important and very much nontrivial part of the design and manufacturing processes for IC production. For example, an Intel® Xeon® processor may contain seven layers of copper interconnect. Design considerations include, for example, using lower-impedance top layers to route clock and power signals, while higher-impedance bottom layers are used for local routing.

Copper (Cu) is often used in high-end processors because it has lower resistivity than less expensive aluminum interconnects. However, copper is disclosed as a nonlimiting example, and teachings of this specification should be understood to also be applicable to metals other than Cu, especially those with high diffusivity into a dielectric, such as silver (Ag). The teachings herein can also be applicable to other metal interconnect applications where it is desirable to impede or retard the diffusion of metals with high diffusivity (e.g., without limitation, Co, Ti, Ni, Ta, Mo, W, Ru) into silicon.

Copper is used in various places throughout this specification as a nonlimiting example of an application of the compounds disclosed herein. In the case of Cu interconnects, unique challenges arise. Copper and the dielectric substrate can diffuse into one another, thus compromising the properties of both. For example, if copper diffuses into a dielectric substrate, it can lead to interconnect leakage, reliability degradation and threshold voltage shifts in the transistor due to "deep-level traps." These traps are "deep" in the sense that large energies are required to remove an electron or hole from the trap to the valence or conduction band, thus interfering with intentional doping (which provides desired, useful properties). In nanometer-scale processes, even small variabilities in material properties can quickly become problematic.

A diffusion barrier may be placed before the copper layer to prevent copper diffusion into the substrate material. In an illustrative process for forming a BEOL interconnect layer, a substrate layer is first deposited. Interconnects on that layer are then etched as trenches in the substrate layer. A diffusion barrier is deposited in the trenches. Finally, the copper conductors are deposited over the diffusion barrier, which should completely surround all copper trace lines.

To achieve both adhesion and a good barrier against diffusion, the bonding between layers may be provided by a chemical reaction of limited range at both boundaries. In some cases, a material that provides good adhesion is a poor diffusion barrier, or a material that is a good diffusion barrier has poor adhesion. Thus, certain existing processes use multiple layers of different materials to achieve both effects. The diffusion barrier should be thick enough to limit copper diffusion, yet thin enough that the combination of the barrier metal(s)-plus-copper-interconnect still has a high enough conductivity to be superior to aluminum, lest the benefit of using copper be lost.

Certain existing interconnect technologies use copper (Cu) metal as the interconnect material. Physical vapor deposition (PVD) is used to place an appropriate barrier metal, such as tantalum (Ta), tantalum-nitride (TaN), or a combination of the two as a diffusion barrier. In PVD, physical processes such as evaporation or sputtering are used to produce a vapor of the deposition (barrier) material, which then coats the substrate. The copper metal is deposited, and a process such as a chemical mechanical polish (CMP) may then be used to remove excess Cu and barrier material from the field region, leaving behind only the Cu filled and barrier lined trenches or dual damascene features.

In certain embodiments, the combination of PVD with Ta or TaN may lead to reduced electrical performance and reliability relative to embodiments disclosed herein. Reduced performance may flow at least in part from the imperfect conformal coating realized by this process. Challenges introduced by this process may include:
   a. High via resistance due to a thick Ta or TaN layer at the via bottom.
   b. High line resistance due to poor PVD conformality in the trench, and Cu/Ta interface scattering, which increases Cu resistivity.
   c. Void defects and electromigration (EM) failures due to Cu agglomeration, which may result from poor barrier/liner step coverage in re-entrant features.
   d. A reduced electroplating gap-fill process window, because the PVD Ta or TaN barrier thickness may scale poorly with sub-14 nm technology.

In some cases, superior conformal coating may be achieved using chemical vapor deposition (CVD) or atomic layer deposition.

In an example of CVD, the substrate is heated and exposed within a reaction chamber to one or more volatile precursors, which may react or decompose on the substrate surface, thus leaving behind (depositing) the desired material. In some embodiments, the process also produces volatile byproducts. These byproducts may be removed by injecting an appropriate gas into the chamber or exhausting them to vacuum.

In an example of ALD, the substrate is first exposed to one or more precursor gases within a reaction chamber. In contrast to CVD, only one precursor is present in the reaction chamber at a time. The precursors are inserted sequentially, in overlapping pulses. With each pulse, the precursor molecules react with the surface of the substrate. Advantageously, these reactions are self-limiting; the reaction terminates once all the reactive sites on the surface are used. Thus, within an "ALD cycle," excess material does not accumulate as it may do in a PVD process. The nature of the precursor-surface chemical reaction determines the maximum thickness of the film, and this thickness is not normally exceeded because of the self-limiting property of the reaction. In some embodiments, the number of ALD cycles may be varied to grow materials with uniformly high precision.

Figure 2:
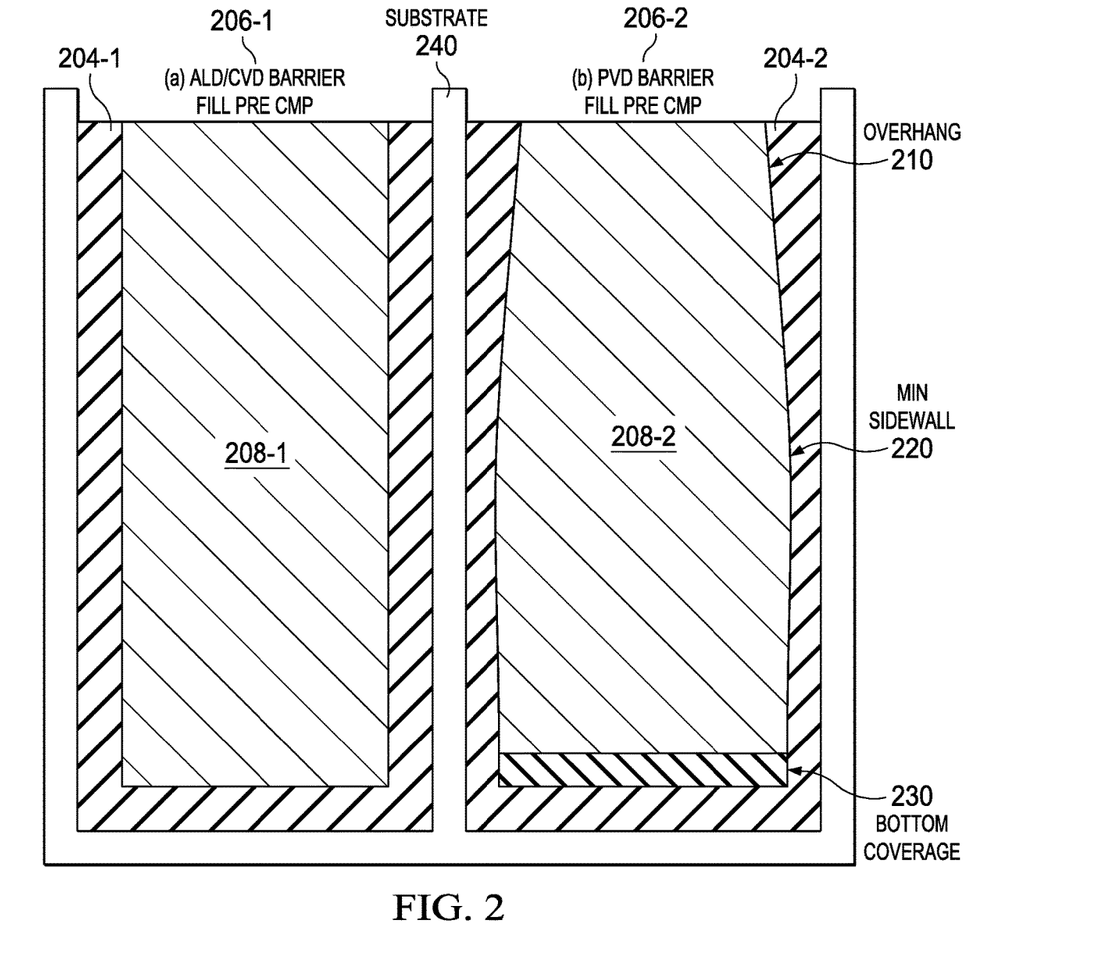
FIG. 2 is a cutaway side view of integrated circuit features according to one or more examples of the present Specification.

Advantageously, CVD and ALD diffusion barriers are more conformal than their PVD counterparts, particularly with respect to the ratio of "bottom coverage" to "minimum sidewall." This is illustrated in FIG. 2, where it is seen that PVD can result in excessive overhand and bottom coverage, while CVD and ALD result in essentially uniform coverage, with the ratio of bottom coverage to minimum sidewall approaching unity.

However, some existing embodiments focus instead on optimizing the conformality of PVD diffusion barriers, hoping to reduce barrier oxidation and avoid Cu agglomeration. These optimizations may not address the inherent non-conformal coating of PVD as discussed above. Rather, the present applicants have found that ALD and CVD diffusion barriers provide superior interconnects, particularly in large-scale manufacturing processing. To help make ALD and CVD processes more pragmatic, this specification discloses materials that have been found to provide improvements in ALD and CVD processes.

In various examples, a quarternary (four-element), quinary (five-element), or other alloy is described, which functions as a diffusion barrier against diffusion of copper, or of other transition or post-transition metals. Diffusion barriers made of these materials exhibit high conformality in ALD and CVD processes, and strong bonding with the substrate and interconnect layer.

Interconnects using the disclosed quarternary or quinary material exhibit advantages, including:
   a. The ability to scale barrier/liner below 14 nm feature size.
   b. Improved conformality in the feature.
   c. Improved via resistance due to the reduction in thickness at feature bottom.
   d. Improved line resistance due to reduction of volume of barrier/liner in the trench.
   e. Reduced interconnect void defects due to improved agglomeration resistance at the interface of the barrier/liner and interconnect metal.
   f. Increased opening width at the top of trenches and vias due to the reduced thickness of the barrier layer.

Several non-limiting examples are described herein. These should be understood as illustrative embodiments, and it is not intended that this disclosure be limited to the specifically-disclosed embodiments below. Rather, these embodiments are provided earnestly for the purpose of assisting practitioners in the art with understanding the properties and advantages of the disclosed materials. Examples include the following:

First Embodiment

The quarternary barrier materials comprises:
   a. a transition metal ("M1");
   b. a post transition metal (for example, aluminum) ("M2");
   c. a metalloid ("N1"); and
   d. a non-metal ("N2").

Formulaically, the alloy may be written as $M1_vM2_wN1_xN2_y$, for example, tungsten-aluminum-silicon-nitride (WAlSiN).

Second Embodiment

The quinary barrier materials comprises:
   a. a transition metal ("M1");

b. a post transition metal (for example, aluminum) ("M2");
c. a metalloid ("N1");
d. two non-metals ("N2").

Formulaically, the alloy may be written as $M1_vM2_wN1_xN2_yN2_z$, for example, tungsten-aluminum-silicon-carbon-nitride (WAlSiCN).

It should be noted that the two embodiments above are referred to as "quarternary" and "quinary" respectively to illustrate the number of primarily-intended elements in the alloys. In some cases, trace amounts of additional elements may be introduced during manufacturing processes, and in sufficiently low concentrations to not degrade the usability of the materials.

Table 1 below illustrates examples of materials that may fill the role of each element named above. These examples should be understood to be non-limiting.

TABLE 1

Embodiments of Quarternary Alloys

| [M1] (Transition Metal) | [M2] Post-Transition Metal | [Ni] Metalloid | [N2] Non-metal |
|---|---|---|---|
| W, Ta, Hf, Mo, Nb, Zr, V, Ti | Al | B, Si | C, N |

Third Embodiment

The quinary barrier materials comprises:
a. a transition metal ("M1");
b. two metalloids ("N1"); and
c. two nonmetals ("N2").

Formulaically, the alloy may be written as $M1_vM2_wN1_xN2_yN2_z$, for example tungsten-boron-silicon-carbon-nitrogen (WBSiCN).

Fourth Embodiment

Any of embodiments 1-3 alloyed with ruthenium (Ru). Formulaically, the alloy may be written as $M1_uRu_vM2_wN1_xN2_yN2_z$. Inclusion of a noble metal, such as ruthenium, may improve agglomeration resistance and improve surface wetting between the barrier/liner and fill material.

The composition of the material (e.g., relative amounts of M1, M2, N1, N2, or Ru) can be engineered to improve any of the interface properties of interest, such as adhesion to metal or dielectric layers, resistivity, barrier performance or to reduce interface scattering, depending on the needs.

The different atomic radii break symmetry in the solid, and thus lead to films that are more amorphous (versus poly-crystalline). Furthermore, the metalloids can stuff grain boundaries, limiting diffusion paths.

The example materials above may enable ALD as a metal diffusion barrier method for fast transition metal diffusers (for example, copper (Cu), silver (Ag), cobalt (Co), and nickel (Ni), by way of non-limiting example).

A diffusion barrier produced according to the present Specification provides advantages, including the following:
a. A predominantly amorphous microstructure eliminates grain boundary paths for Cu diffusion, which may be experienced with diffusion barriers made of single or binary-element materials. This increases the reliability by reducing Cu electromigration. Multi-component barriers improve barrier properties by increasing the activation energy for Cu diffusion into silicon.
b. Because of the chemical and interface stability of the disclosed material, the need for a separate liner (for adhesion) and barrier (for diffusion) can be eliminated in certain embodiments. However, this should not be understood to preclude the use of a separate liner, which is compatible with the teachings of this Specification.
c. The disclosed material and process enable conformal deposition techniques, such as CVD and ALD.
d. The disclosed material and process maintain compatibility with existing process modules such as Cu seed and electroplating.

A system and method for providing improved diffusion barriers will now be described with more particular reference to the attached FIGURES. It should be noted that throughout the FIGURES, certain reference numerals may be repeated to indicate that a particular device or block is wholly or substantially consistent across the FIGURES. This is not, however, intended to imply any particular relationship between the various embodiments disclosed. In certain examples, a genus of elements may be referred to by a particular reference numeral ("widget 10"), while individual species or examples of the genus may be referred to by a hyphenated numeral ("first specific widget 10-1" and "second specific widget 10-2").

Figure 1:
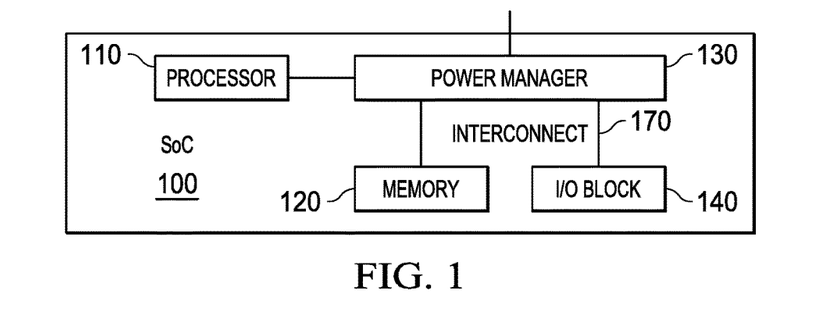
FIG. 1 is a block diagram of an integrated circuit according to one or more examples of the present Specification.

FIG. 1 is a block diagram of system-on-a chip (SoC) 100 according to one or more examples of the present Specification. SoC 100 is disclosed as a non-limiting example, but in a more general sense, the teachings of this Specification are applicable to providing any suitable computing device. In various embodiments, a "computing device" may be or comprise, by way of non-limiting example, a computer, workstation, server, mainframe, virtual machine (whether emulated or on a "bare-metal" hypervisor), embedded computer, embedded controller, embedded sensor, personal digital assistant, laptop computer, cellular telephone, IP telephone, smart phone, tablet computer, convertible tablet computer, computing appliance, network appliance, receiver, wearable computer, handheld calculator, or any other electronic, microelectronic, or microelectromechanical device for processing and communicating data.

In an example, SoC 100 may be manufactured according to the methods disclosed herein. More particularly, SoC 100 may include a number of computing elements, each of which is tightly integrated in a single chip. This may require highly complex routing, which may require multiple layers of routing, including vias and tracelines. These vias and tracelines may be lined with a diffusion barrier as described in this Specification. Furthermore, in embodiments where a computer is used that is not an SoC (such as a traditional desktop computer), certain computing elements of that desktop computer, such as the CPU, may be manufactured according to the present Specification, including the disclosed diffusion barriers.

In this example, SoC 100 includes a number of computing elements, which include any active or passive elements of SoC 100 that contribute to SoC 100 to perform its intended function. In this example, processor 110 connected to a memory 120, having stored therein executable instructions for providing appropriate software, such as an operating system and operational software. Other components of SoC 100 include an input/output (I/O) block 140 and a power manager 130. This architecture is provided by way of example only, and is intended to be non-exclusive and non-limiting. In a specific example, each of the listed components may be a physically separate intellectual property (IP) block, designed in advance for use on SoC 100, and each may occupy a separate space on a silicon wafer. The separate IP blocks may communicate with each other via an on-chip interconnect fabric.

In other examples, the various disclosed blocks may be logical divisions only, and need not necessarily represent physically separate hardware and/or software components. Certain computing devices provide main memory and storage, for example, in a single physical memory device, and others provide them in separate devices. In the case of virtual machines or hypervisors, all or part of a function may be provided in the form of software or firmware running over a virtualization layer to provide the disclosed logical function. In other examples, a device such as a network interface may provide only the minimum hardware interfaces necessary to perform its logical operation, and may rely on a software driver to provide additional necessary logic. Thus, as appropriate to the embodiment, each logical block disclosed herein may broadly include one or more logic elements configured and operable for providing the disclosed logical operation of that block. As used throughout this Specification, a "logic element" may include hardware, external hardware (digital, analog, or mixed-signal), software, reciprocating software, services, drivers, interfaces, components, modules, algorithms, sensors, components, firmware, microcode, programmable logic, or objects that can coordinate to achieve a logical operation.

In an example, processor 110 may be communicatively coupled to memory 120 via any suitable memory bus, which may be for example a direct memory access (DMA) or any other suitable bus. Processor 110 may be communicatively coupled to other devices via a system bus or fabric. As used throughout this Specification, a "fabric" includes any wired or wireless interconnection line, network, connection, bundle, single bus, multiple buses, crossbar network, single-stage network, multistage network or other conduction medium operable to carry data, signals, or power between parts of a computing device, or between computing devices. It should be noted that these uses are disclosed by way of non-limiting example only, and that some embodiments may omit one or more of the foregoing buses, while others may employ additional or different buses.

In various examples, a "processor" may include any combination of logic elements operable to execute instructions, whether loaded from memory, or implemented directly in hardware, including by way of non-limiting example a microprocessor, digital signal processor, field-programmable gate array, graphics processing unit, programmable logic array, application-specific integrated circuit, or virtual machine processor. In certain architectures, a multi-core processor may be provided, in which case processor 110 may be treated as only one core of a multi-core processor, or may be treated as the entire multi-core processor, as appropriate. In some embodiments, one or more co-processors may also be provided for specialized or support functions.

To simplify this disclosure, memory 120 is disclosed as a single logical block, but in a physical embodiment may include one or more blocks of any suitable volatile or non-volatile memory technology or technologies, including for example DDR RAM, SRAM, DRAM, cache, L1 or L2 memory, on-chip memory, registers, flash, ROM, optical media, virtual memory regions, magnetic or tape memory, or similar. In certain embodiments, memory 120 may comprise both a relatively low-latency volatile main memory, and a relatively higher-latency non-volatile memory. However, the two species of memory need not be physically separate devices, and in some examples may represent simply a logical separation of function (for example, in some devices, all memory is volatile, or all memory is nonvolatile). It should also be noted that although DMA is disclosed by way of non-limiting example, DMA is not the only protocol consistent with this Specification, and that other memory architectures are available.

Memory 120 may include one or more non-transitory computer-readable mediums, including by way of non-limiting example, a hard drive, solid-state drive, external storage, redundant array of independent disks (RAID), network-attached storage, optical storage, tape drive, backup system, cloud storage, or any combination of the foregoing. Memory 120 may be, or may include therein, a database or databases or data stored in other configurations, and may include a stored copy of operational software such as an operating system and operational software. Many other configurations are also possible, and are intended to be encompassed within the broad scope of this Specification.

I/O block 140 may be provided to communicatively couple SoC 100 to a wired or wireless network. A "network," as used throughout this Specification, may include any communicative platform operable to exchange data or information within or between computing devices, including by way of non-limiting example, serial or parallel communication ports, an ad-hoc local network, an internet architecture providing computing devices with the ability to electronically interact, an asynchronous transfer mode (ATM) network, a plain old telephone system (POTS), which computing devices could use to perform transactions in which they may be assisted by human operators or in which they may manually key data into a telephone or other suitable electronic equipment, any packet data network (PDN) offering a communications interface or exchange between any two nodes in a system, or any local area network (LAN), metropolitan area network (MAN), wide area network (WAN), wireless local area network (WLAN), virtual private network (VPN), intranet, or any other appropriate architecture or system that facilitates communications in a network or telephonic environment.

Power manager 130 may be or include a power supply, as well as logic to regulate power to SoC 100. For example, power manager 130 may include logic to detect different operating modes, and to intelligently provide a regulated voltage to on-chip components as the demands of those operating modes dictate.

For example, temperature sensors within power manager 130 may detect when the temperature of processor 110 rises above a threshold, which may indicate that processor 110 is in danger of being damaged. To prevent damage, power manager 130 may reduce the voltage supplied to processor 110, thus reducing the operating power, and reducing the temperature.

Power manager 130 may also supply different input voltages to different computing elements of SoC 100 according to the power demands of those processing elements. In various embodiments, power manager 130 may also include current limiters, voltage references, meters, sensors, transducers, drivers, switches, and any other elements that assist power manager 130 in performing its work.

Finally, an interconnect 170 is also provided, which may be an on-chip fabric or other suitable interconnect for routing data between the various components.

FIG. 2 is a cutaway side view of selected features of an IC according to one or more examples of the present Specification. Specifically visible in FIG. 2 are trenches

206-1 and 206-2. Trenches 206 may have been etched in a suitable substrate material 240, such as a dielectric or metal. Trench 206-1 differs from trench 206-2 in that trench 206-1 has been provided a diffusion barrier 204-1 by a process such as ALD or CVD. In contrast, trench 206-2 has been provided a diffusion barrier 204-2 by a process such as PVD. Note that for purposes of comparison, trenches 204 have been shown etched in the same substrate, but in practice it is generally not practical to selectively perform ALD or CVD on a first plurality of trenches, and PVD on a second plurality of trenches within the same substrate.

In this example, PVD has been used to place an appropriate barrier metal, such as tantalum (Ta), tantalum-nitride (TaN), or a combination of the two, within trench 206-2 as a diffusion barrier 204-2. As discussed above, in PVD, physical processes such as evaporation or sputtering are used to produce a vapor of the deposition (barrier) material, which then coats the substrate.

In certain embodiments, the combination of PVD with Ta or TaN may lead to reduced electrical performance and reliability relative to trench 206-1. Reduced performance may flow at least in part from the imperfect conformal coating realized by this process, as can be seen in the substantial overhang 210, and excessive bottom coverage 230. Challenges introduced by this process may include:

a. High via resistance due to a thick Ta or TaN layer at the via bottom 230.
 b. High line resistance due to poor PVD conformality in the trench, and Cu/Ta interface scattering, which increases Cu resistivity.
 c. Void defects and electromigration (EM) failures due to Cu agglomeration, which may result from poor barrier/liner step coverage in re-entrant features.
 d. A reduced electroplating gap-fill process window, because the PVD Ta or TaN barrier thickness may scale poorly with sub-14 nm technology.

In contrast, trench 206-1 has been lined with a process such as CVD or ALD.

In an example of CVD, substrate 240 is exposed within a reaction chamber to one or more volatile precursors, which may react or decompose on the substrate surface, thus leaving behind (depositing) the desired material, such as the quaternary or quinary materials discussed above. This forms diffusion barrier 204-1. In some embodiments, the process also produces volatile byproducts. These may be removed by injecting an appropriate gas into the chamber.

In an example of ALD, substrate 240 is first exposed to one or more precursor gases within a reaction chamber. In contrast to CVD, only one precursor is present in the reaction chamber at a time. The precursors are inserted sequentially, in overlapping pulses. With each pulse, the precursor molecules react with the surface of the substrate. Advantageously, these reactions are self-limiting; the reaction terminates once all the reactive sites on the surface are used. Thus, within an "ALD cycle," excess material does not accumulate as it may do in a PVD process. The nature of the precursor-surface chemical reaction determines the maximum thickness of the film, and this thickness is not normally exceeded because of the self-limiting property of the reaction. In some embodiments, the number of ALD cycles may be varied to grow materials with uniformly high precision. This process leaves behind diffusion barrier 204-1.

In either case, trench 206-1 is provided with a barrier and is filled with conductor 208-1. A CMP may then be used to polish away excess material.

Advantageously, diffusion barrier 204-1 is more conformal than PVD diffusion barrier 204-2, particularly with respect to the ratio of bottom coverage 230 to minimum sidewall 220. In the case of trench 206-2, bottom coverage 230 is much thicker than minimum sidewall 220. A substantial overhang 210 is also observed. In contrast, for trench 206-1, the ratio between bottom coverage 230 and minimum sidewall 220 is much closer to unity, and no substantial overhang 210 is observed. Note that diffusion barrier 204-1 occupies less volume of the trench than diffusion barrier 204-2.

Figure 3:
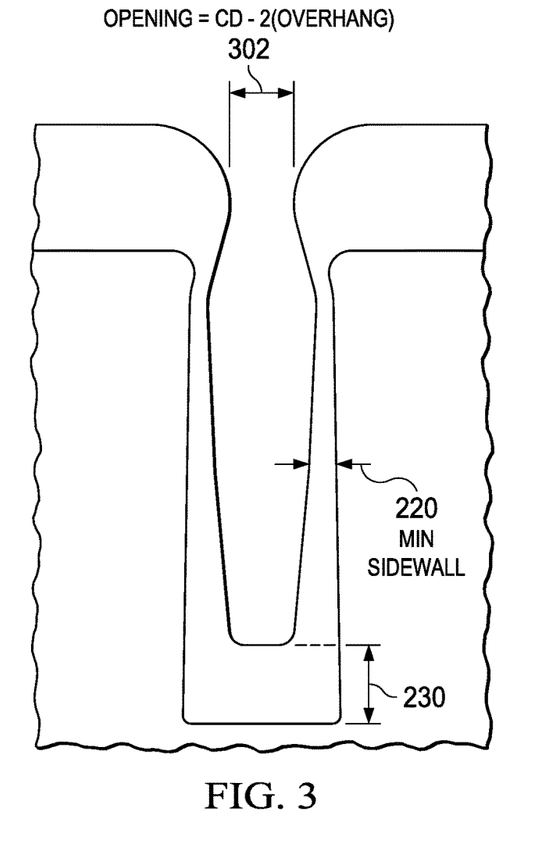
FIG. 3 is a cutaway side view of an integrated circuit feature according to one or more examples of the present Specification.

FIG. 3 illustrates a mathematical basis for computing the total available opening 302 available in trench 206-2. Specifically, the opening is equal to critical dimension (CD) minus twice the overhang:

$$O = CD - 2(OH)$$

As geometries scale, the PVD overhang consumes valuable feature opening for gap fill. Also note that the ratio of bottom coverage 230 to minimum sidewall 220 far exceeds unity $$\left(\frac{BC}{MS} \gg 1\right).$$

Thus, the diffusion barrier 204-2 consumes more of the volume of trench 204-2 than is desirable.

Figure 4:
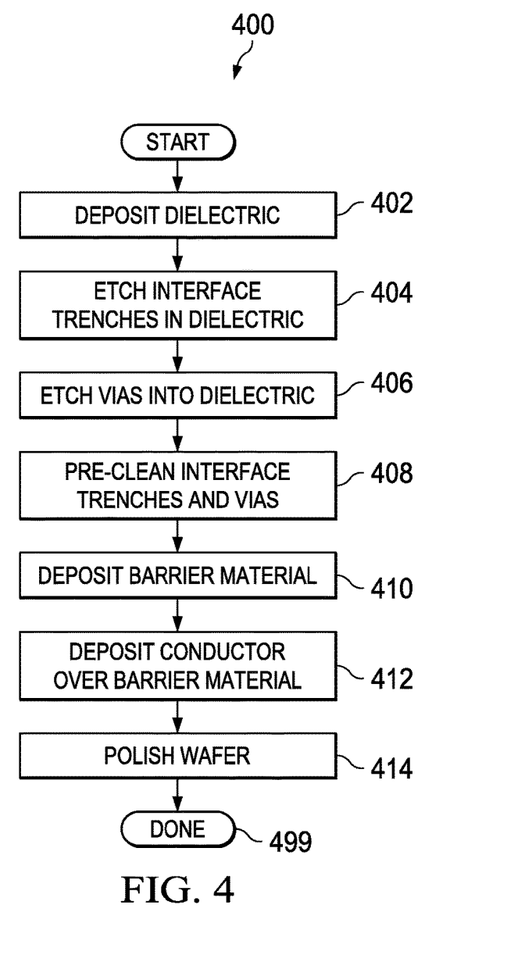
FIG. 4 is a flow chart of a method of manufacturing an integrated circuit according to one or more examples of the present Specification.

FIG. 4 is a flow chart of a method 400 of manufacturing an IC, such as SoC 100 or any other suitable IC, according to one or more examples of the present Specification. It should be noted that this method provides only selected processes within the overall manufacturing method. Specifically, selected portions of BEOL are disclosed here, specifically focusing on manufacturing one or more layers of interconnects.

In block 402, the dielectric substrate is first deposited. This may be any suitable dielectric. In common contemporary practice, this may be a dielectric such as silicon dioxide or similar. However, this example is not intended to be limiting.

In block 404, interface trenches are etched into the dielectric. According to common contemporary practice, this may employ photolithography and a chemical etch. However, any suitable method may be used.

In block 406, vias are etched into the dielectric. Vias are through-holes that connect one layer to another. Again, this may include using photolithography and a chemical etch, but any suitable method may be used.

In block 408, the interface trenches and vias etched in blocks 404 and 406 are cleaned. This may be a chemical cleaning, but any suitable method may be used.

In block 410, the barrier material is deposited. In this case, the barrier material may be any suitable barrier material, including any of the chemical compounds described above, or any other suitable material. Deposition may be accomplished by any suitable process, including PVD, ALD, or CVD.

In block 412, a conductor material is deposited over the barrier material. This may be copper, or any other suitable conductor, including aluminum, cobalt, silver, or other suitable conductor.

In block 414, the wafer is polished. This may be, for example, a chemical-mechanical polish (CMP), in which the wafer is placed face down and rotated against a rotating polishing pad. An aqueous slurry may be used as a buffer, and a laser reflection may be used to determine when the material has been cleared away.

The operations of blocks 402-499 may be repeated for as many layers as are necessary to complete the manufacturing.

The foregoing outlines features of several embodiments so that those skilled in the art may better understand various aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

All or part of any hardware element disclosed herein may readily be provided in a system-on-a-chip (SoC), including central processing unit (CPU) package. An SoC represents an integrated circuit (IC) that integrates components of a computer or other electronic system into a single chip. Thus, for example, client devices or server devices may be provided, in whole or in part, in an SoC. The SoC may contain digital, analog, mixed-signal, and radio frequency functions, all of which may be provided on a single chip substrate. Other embodiments may include a multi-chip-module (MCM), with a plurality of chips located within a single electronic package and configured to interact closely with each other through the electronic package. In various other embodiments, the computing functionalities disclosed herein may be implemented in one or more silicon cores in Application Specific Integrated Circuits (ASICs), Field Programmable Gate Arrays (FPGAs), and other semiconductor chips.

Note also that in certain embodiment, some of the components may be omitted or consolidated. In a general sense, the arrangements depicted in the figures may be more logical in their representations, whereas a physical architecture may include various permutations, combinations, and/or hybrids of these elements. It is imperative to note that countless possible design configurations can be used to achieve the operational objectives outlined herein. Accordingly, the associated infrastructure has a myriad of substitute arrangements, design choices, device possibilities, hardware configurations, software implementations, and equipment options.

In a general sense, any suitably-configured processor can execute any type of instructions associated with the data to achieve the operations detailed herein. Any processor disclosed herein could transform an element or an article (for example, data) from one state or thing to another state or thing. In another example, some activities outlined herein may be implemented with fixed logic or programmable logic (for example, software and/or computer instructions executed by a processor) and the elements identified herein could be some type of a programmable processor, programmable digital logic (for example, a field programmable gate array (FPGA), an erasable programmable read only memory (EPROM), an electrically erasable programmable read only memory (EEPROM)), an ASIC that includes digital logic, software, code, electronic instructions, flash memory, optical disks, CD-ROMs, DVD ROMs, magnetic or optical cards, other types of machine-readable mediums suitable for storing electronic instructions, or any suitable combination thereof.

In operation, a storage may store information in any suitable type of tangible, non-transitory storage medium (for example, random access memory (RAM), read only memory (ROM), field programmable gate array (FPGA), erasable programmable read only memory (EPROM), electrically erasable programmable ROM (EEPROM), etc.), software, hardware (for example, processor instructions or microcode), or in any other suitable component, device, element, or object where appropriate and based on particular needs. Furthermore, the information being tracked, sent, received, or stored in a processor could be provided in any database, register, table, cache, queue, control list, or storage structure, based on particular needs and implementations, all of which could be referenced in any suitable timeframe. Any of the memory or storage elements disclosed herein should be construed as being encompassed within the broad terms 'memory' and 'storage,' as appropriate. A non-transitory storage medium herein is expressly intended to include any non-transitory special-purpose or programmable hardware configured to provide the disclosed operations, or to cause a processor to perform the disclosed operations.

Computer program logic implementing all or part of the functionality described herein is embodied in various forms, including, but in no way limited to, a source code form, a computer executable form, machine instructions or microcode, programmable hardware, and various intermediate forms (for example, forms generated by an assembler, compiler, linker, or locator). In an example, source code includes a series of computer program instructions implemented in various programming languages, such as an object code, an assembly language, or a high-level language such as OpenCL, FORTRAN, C, C++, JAVA, or HTML for use with various operating systems or operating environments, or in hardware description languages such as Spice, Verilog, and VHDL. The source code may define and use various data structures and communication messages. The source code may be in a computer executable form (e.g., via an interpreter), or the source code may be converted (e.g., via a translator, assembler, or compiler) into a computer executable form, or converted to an intermediate form such as byte code. Where appropriate, any of the foregoing may be used to build or describe appropriate discrete or integrated circuits, whether sequential, combinatorial, state machines, or otherwise.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processor and memory can be suitably coupled to the board based on particular configuration needs, processing demands, and computing designs. Other components such as external storage, additional sensors, controllers for audio/video display, and peripheral devices may be attached to the board as plug-in cards, via cables, or integrated into the board itself. In another example, the electrical circuits of the FIGURES may be implemented as stand-alone modules (e.g., a device with associated components and circuitry configured to perform a specific application or function) or implemented as plug-in modules into application specific hardware of electronic devices.

Note that with the numerous examples provided herein, interaction may be described in terms of two, three, four, or more electrical components. However, this has been done for purposes of clarity and example only. It should be appreciated that the system can be consolidated or reconfigured in any suitable manner. Along similar design alternatives, any of the illustrated components, modules, and elements of the FIGURES may be combined in various possible configurations, all of which are within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 (pre-AIA) or paragraph (f) of the same section (post-AIA), as it exists on the date of the filing hereof unless the words "means for" or "steps for" are specifically used in the particular claims; and (b) does not intend, by any statement in the Specification, to limit this disclosure in any way that is not otherwise expressly reflected in the appended claims.

EXAMPLE IMPLEMENTATIONS

There is disclosed in one example, a chemical compound, comprising a transition metal, a post-transition metal, a metalloid, and a non-metal.

There is further disclosed an example, wherein the post-transition metal is aluminum.

There is further disclosed an example, wherein the transition metal is selected from the group consisting of tungsten, tantalum, hafnium, molybdenum, niobium, zirconium, vanadium, and titanium.

There is further disclosed an example, wherein the metalloid is selected from the group consisting of boron and silicon.

There is further disclosed an example, wherein the nonmetal is selected from the group consisting of carbon and nitrogen.

There is further disclosed an example, further comprising a second transition metal.

There is further disclosed an example, wherein the second transition metal is ruthenium.

There is further disclosed an example, wherein the second transition metal is selected from the group consisting of ruthenium, palladium, platinum, osmium, rhodium, and iridium.

There is further disclosed an example, wherein the nonmetal is carbon, and further comprising nitrogen.

There is further disclosed an example, wherein the compound is tungsten-aluminum-silicon-carbon-nitride (WAlSiCN).

There is further disclosed an example, wherein the compound is tantalum-ruthenium-aluminum-carbon-nitride (TaRuAlCN).

There is further disclosed an example, wherein the compound is tungsten-ruthenium-aluminum-carbon-nitride (WRuAlCN).

There is further disclosed an example, wherein the compound is tantalum-ruthenium-boron-carbon-nitride (TaRuBCN).

There is further disclosed an example, wherein the compound is tungsten-ruthenium-boron-carbon-nitride (WRuBCN).

There is further disclosed an example, wherein the compound is tantalum-aluminum-silicon-carbon-nitride (TaAlSiCN).

There is further disclosed an example, wherein the compound is zirconium-ruthenium-silicon-carbon-nitride (ZrRuSiCN).

There is further disclosed an example, wherein the compound is zirconium-silicon-carbon-nitride (ZrSiCN).

There is further disclosed in an example, a process of manufacturing an integrated circuit, comprising: depositing a dielectric; etching an interface trench in the dielectric; etching a via into the dielectric; pre-cleaning the interface trench; depositing a barrier material, the barrier material comprising a transition metal, a post-transition metal, a metalloid, and a nonmetal; depositing a conductor over the barrier material; and polishing the integrated circuit.

There is further disclosed an example, wherein the post-transition metal is aluminum.

There is further disclosed an example, wherein the transition metal is selected from the group consisting of tungsten, tantalum, hafnium, molybdenum, niobium, zirconium, vanadium, and titanium.

There is further disclosed an example, wherein the metalloid is selected from the group consisting of boron and silicon.

There is further disclosed an example, wherein the nonmetal is selected from the group consisting of carbon and nitrogen.

There is further disclosed an example, further comprising a second transition metal.

There is further disclosed an example, wherein the barrier material is the material of any preceding example.

There is further disclosed in an example, an integrated circuit, comprising: a plurality of computational units; an interconnect network configured to communicatively couple the computational units, wherein the interconnect network comprises a plurality of interfaces, comprising a trench having disposed thereon a barrier material, having disposed thereon a conductive material, wherein the barrier material comprises a chemical compound, comprising a transition metal, a post-transition metal, a metalloid, and a non-metal.

There is further disclosed an example, wherein the conductive material is selected from the group consisting of copper, silver, cobalt, and nickel.

There is further disclosed an example, wherein the conductive material is selected from the group consisting of tungsten, ruthenium, aluminum, tantalum, and titanium.

There is further disclosed an example, wherein the barrier material is the material of any preceding example.

There is further disclosed an example of an apparatus comprising means for performing the method.

There is further disclosed an example wherein the means comprise a processor and a memory.

There is further disclosed an example, wherein the means comprise fabrication equipment.

The invention claimed is:

1. A semiconductor device, the semiconductor device comprising a chemical compound that includes a transition metal, a post-transition metal, a metalloid, and a non-metal, wherein the compound is tungsten-aluminum-silicon-carbon-nitride (WAlSiCN) or tantalum-aluminum-silicon-carbon-nitride (TaAlSiCN).

2. The semiconductor device of claim 1, wherein the chemical compound further includes a second transition metal.

3. The semiconductor device of claim 2, wherein the second transition metal is ruthenium.

4. The semiconductor device of claim 2, wherein the second transition metal is selected from the group consisting of ruthenium, palladium, platinum, osmium, rhodium, and iridium.

5. The semiconductor device of claim 1,
wherein the chemical compound is included within an integrated circuit that includes a plurality of computational units, and an interconnect network configured to communicatively couple the computational units,
wherein the interconnect network comprises a plurality of interfaces, including a trench, the trench having a barrier material and;
a conductive material, and
wherein the barrier material includes the chemical compound.

6. The semiconductor device of claim 1, further comprising an interconnect network, the interconnect network including at least one interconnect structure that includes a barrier material and a conductive material, where the barrier material includes the chemical compound.

7. The semiconductor device of claim 6, wherein the conductive material includes one or more of copper, silver, cobalt, nickel, tungsten, ruthenium, aluminum, tantalum, and titanium.

8. The semiconductor device of claim 6, further comprising a plurality of transistors, where the interconnect network is configured to communicatively couple at least some of the transistors.

9. The semiconductor device of claim 1, where the semiconductor device is an integrated circuit that includes at least one trench or via having a barrier material, and where the barrier material includes the chemical compound.

10. The semiconductor device of claim 9, wherein the at least one trench or via further includes a conductive material.

11. A semiconductor device, the semiconductor device comprising a chemical compound, wherein the compound includes tantalum-ruthenium-aluminum-carbon-nitride (TaRuAlCN), tungsten-ruthenium-aluminum-carbon-nitride (WRuAlCN), tantalum-ruthenium-boron-carbon-nitride (TaRuBCN), or tungsten-ruthenium-boron-carbon-nitride (WRuBCN).

12. The semiconductor device of claim 11, further comprising an interconnect network, the interconnect network including at least one interconnect structure that includes a barrier material and a conductive material, where the barrier material includes the chemical compound.

13. The semiconductor device of claim 12, wherein the conductive material includes one or more of copper, silver, cobalt, nickel, tungsten, ruthenium, aluminum, tantalum, and titanium.

14. The semiconductor device of claim 12, further comprising a plurality of transistors, where the interconnect network is configured to communicatively couple at least some of the transistors.

15. The semiconductor device of claim 11, where the semiconductor device is an integrated circuit that includes at least one trench or via having a barrier material, and where the barrier material includes the chemical compound.

16. The semiconductor device of claim 15, wherein the at least one trench or via further includes a conductive material.

17. A semiconductor device, the semiconductor device comprising a chemical compound, wherein the compound includes a transition metal, a post-transition metal, a metalloid, and a nonmetal, wherein the compound is zirconium-ruthenium-silicon-carbon-nitride (ZrRuSiCN) or zirconium-silicon-carbon-nitride (ZrSiCN).

18. The semiconductor device of claim 17, further comprising an interconnect network, the interconnect network including at least one interconnect structure that includes a barrier material and a conductive material, where the barrier material includes the chemical compound.

19. The semiconductor device of claim 18, wherein the conductive material includes one or more of copper, silver, cobalt, nickel, tungsten, ruthenium, aluminum, tantalum, and titanium.

20. The semiconductor device of claim 1, further comprising a plurality of transistors, where the interconnect network is configured to communicatively couple at least some of the transistors.

21. The semiconductor device of claim 17, where the semiconductor device is an integrated circuit that includes at least one trench or via having a barrier material, and where the barrier material includes the chemical compound.

22. The semiconductor device of claim 21, wherein the at least one trench or via further includes a conductive material.

23. A process of manufacturing an integrated circuit, the process comprising:
depositing a dielectric;
forming, in the dielectric, an opening for an interconnect;
depositing, in the opening, a barrier material, the barrier material comprising a chemical compound, wherein the chemical compound includes one or more of tungsten-aluminum-silicon-carbon-nitride (WAlSiCN), tantalum-aluminum-silicon-carbon-nitride (TaAlSiCN), tantalum-ruthenium-aluminum-carbon-nitride (TaRuAlCN), tungsten-ruthenium-aluminum-carbon-nitride (WRuAlCN), tantalum-ruthenium-boron-carbon-nitride (TaRuBCN), tungsten-ruthenium-boron-carbon-nitride (WRuBCN), zirconium-ruthenium-silicon-carbon-nitride(ZrRuSiCN), and zirconium-silicon-carbon-nitride (ZrSiCN); and
depositing, in the opening with the barrier material, a conductive material.

24. The process of claim 23, wherein forming the opening includes performing an etch to form the opening.

25. The process of claim 23, wherein the conductive material includes one or more of copper, silver, cobalt, nickel, tungsten, ruthenium, aluminum, tantalum, and titanium.

* * * * *

UNITED STATES PATENT AND TRADEMARK OFFICE
CERTIFICATE OF CORRECTION

PATENT NO. : 10,651,082 B2
APPLICATION NO. : 16/081713
DATED : May 12, 2020
INVENTOR(S) : Daniel J. Zierath et al.

Page 1 of 1

It is certified that error appears in the above-identified patent and that said Letters Patent is hereby corrected as shown below:

In the Claims

Column 15, Line 3, in Claim 1, delete "(WAlSiCN)" and insert -- (WAlSiCN) --, therefor.

Column 15, Line 18, in Claim 5, delete "units," and insert -- units --, therefor.

Column 15, Line 22, in Claim 5, delete "and;" and insert -- and --, therefor.

Column 15, Line 48-49, in Claim 11, delete "(TaRuAlCN)," and insert -- (TaRuAlCN), --, therefor.

Column 15, Line 50, in Claim 11, delete "(WRuAlCN)," and insert -- (WRuAlCN), --, therefor.

Column 16, Line 26, in Claim 20, delete "1," and insert -- 18, --, therefor.

Column 16, Line 44, in Claim 23, delete "(WAlSiCN)," and insert -- (WAlSiCN), --, therefor.

Column 16, Line 46-47, in Claim 23, delete "(TaRuAlCN)," and insert -- (TaRuAlCN), --, therefor.

Column 16, Line 48, in Claim 23, delete "(WRuAlCN)," and insert -- (WRuAlCN), --, therefor.

Signed and Sealed this
Seventh Day of July, 2020

Andrei Iancu
*Director of the United States Patent and Trademark Office*